United States Patent [19]

Auneau et al.

[11] Patent Number: 4,881,048
[45] Date of Patent: Nov. 14, 1989

[54] OSCILLATOR FREQUENCY LOCKING AND PREPOSITIONING CIRCUIT

[75] Inventors: Gisèle Auneau; Alain Boulanger, both of Brest, France

[73] Assignee: Thomson-CSF, Paris, France

[21] Appl. No.: 298,901

[22] Filed: Jan. 19, 1989

[30] Foreign Application Priority Data

Jan. 22, 1988 [FR] France ................................. 88 00680

[51] Int. Cl.⁴ ........................... H03L 7/02; H03L 7/16
[52] U.S. Cl. ........................................ 331/14; 331/16; 331/18
[58] Field of Search .................. 331/1 R, 1 A, 14, 16, 331/18

[56] References Cited

U.S. PATENT DOCUMENTS

| 3,274,511 | 9/1966 | Dale et al. | 331/14 X |
| 3,297,965 | 1/1967 | Chadima, II | 331/14 X |

FOREIGN PATENT DOCUMENTS

| 0041882 | 12/1981 | European Pat. Off. |
| 1324563 | 3/1963 | France |
| 2192412 | 2/1974 | France |
| 2439511 | 5/1980 | France |

Primary Examiner—Siegfried H. Grimm
Attorney, Agent, or Firm—Oblon, Spivak, McClelland, Maier & Neustadt

[57] ABSTRACT

A frequency locking device, with pre-positioning in which an oscillator is controlled by the output of a frequency discriminator. Shifts in the frequency discriminator are removed by performing calibrations on this discriminator through two signals with known frequencies Fo and F1 produced by a generator. The signal resulting from this calibration is used to prepare a reference voltage for a digital/analog converter which also receives a digital oscillator control signal and which then produces a voltage representing the control voltage of the oscillator.

9 Claims, 2 Drawing Sheets

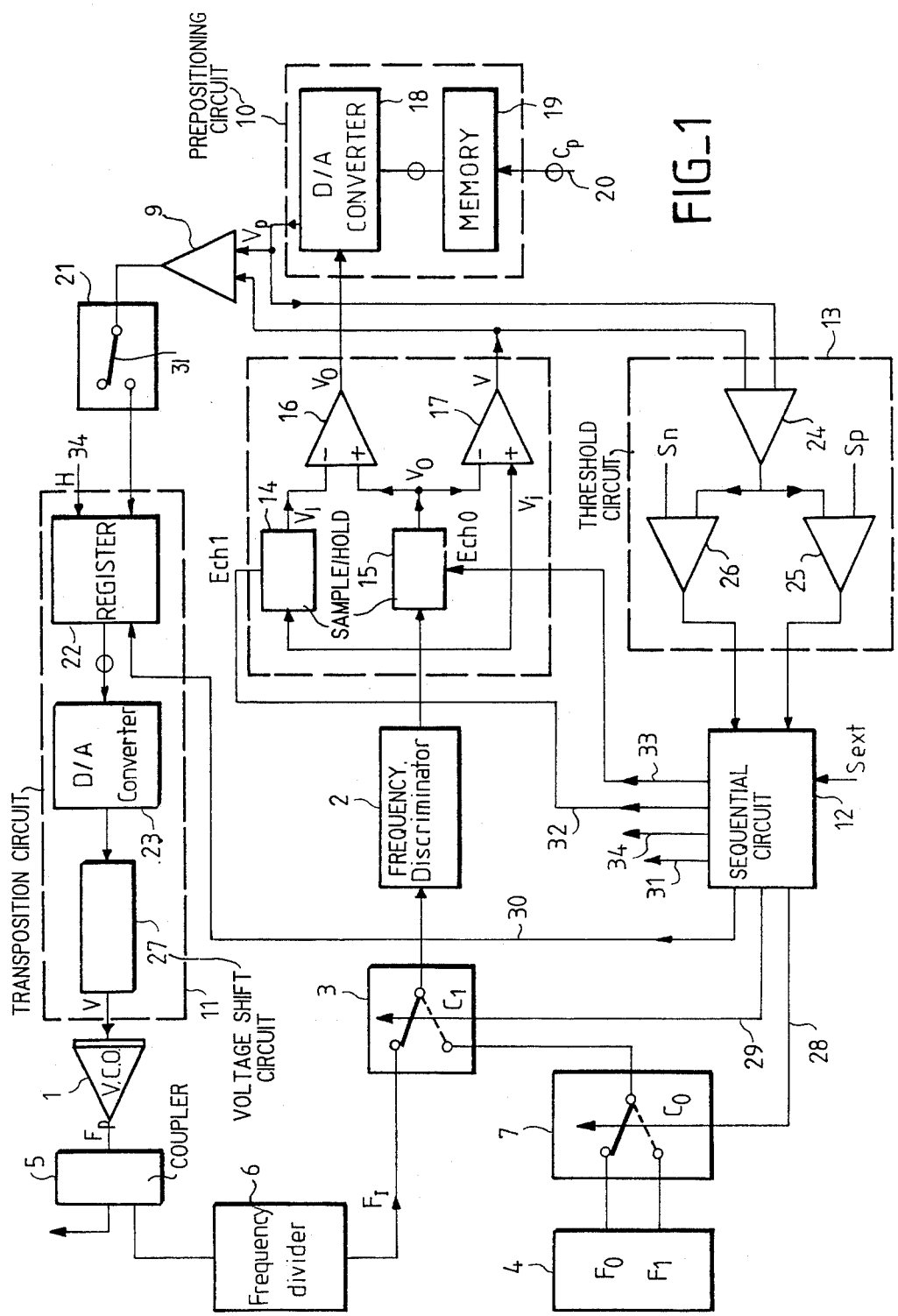
FIG_1

FIG_2
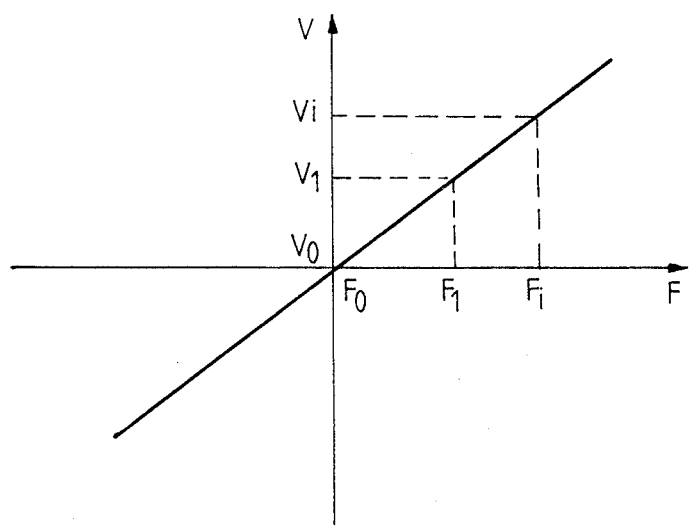
FIG_3
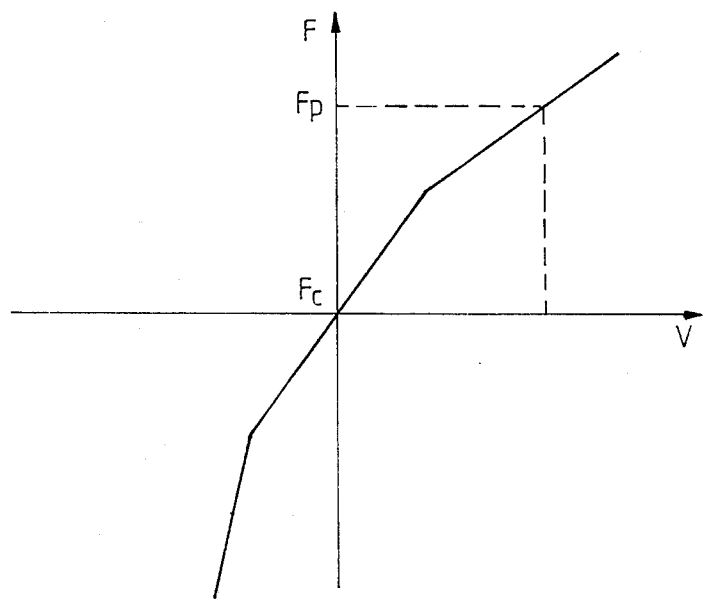

OSCILLATOR FREQUENCY LOCKING AND PREPOSITIONING CIRCUIT

BACKGROUND OF THE INVENTION

1. Field of the Invention

The invention concerns devices for the frequency locking of an oscillator and, more particularly, a device of this type wherein there is provision for a pre-positioning of the frequency before the locking operation proper.

2. Description of the Prior Art

Generators of signals at different frequencies often use variable frequency oscillators which are controlled by a voltage: these oscillators are more commonly known as VCOs or voltage controlled oscillators. The different frequencies are obtained by applying voltages of determined values to this oscillator, with each value corresponding to a frequency and, by comparing the frequency of the output signal of the oscillator, possibly multiplied or divided, with a standard frequency given by an oscillator of stable frequency, such as a quartz oscillator. This comparison is made by means of a phase detector used to prepare an error signal. This error signal is used to modify the frequency of the variable frequency operator so as to reduce this error signal.

In a frequency locking device of this type, it will be understood that major shifts in frequency appear as a function of the variation in the characteristics of the components, notably as a function of the temperature and of their ageing rate. To overcome this drawback, it becomes necessary to use components that have been calibrated and sorted out with precision, are hardly sensitive to temperature and are capable of using thermostatic chambers to protect certain components against variations in temperature. This method results in devices that are complicated and costly.

The aim of the present invention, therefore, is to make a frequency locking device which is stable in temperature and in the course of time, without resorting to particular components or thermostatic chambers.

To achieve this aim, the invention achieves, in the frequency locking device, a self-calibration of a major element, namely the frequency discriminator.

SUMMARY OF THE INVENTION

The invention relates to a frequency locking device for an oscillator of a type with voltage control of the frequency of said oscillator, which comprises a frequency discriminator to which there is applied a first frequency signal Fi, having a determined frequency relationship with the frequency Fp of the output signal of said oscillator, said frequency locking device further comprising:
- a first generator of a second signal with a frequency Fo;
- a second generator of a third signal with a frequency F1;
- switching-over means to apply the second and third signals and then the first signal, successively, to the frequency discriminator;
- means connected to the output of the frequency generator to give, firstly, a first voltage Vo representing the frequency deviation Fo−F1 and, secondly, a second voltage V representing the frequency deviation Fi−Fo;
- means for the preparation, with the first voltage Vo, of a control voltage to be applied to said oscillator to obtain a determined frequency Fp, and
- a sequential circuit to prepare control signals for the above-mentioned means.

BRIEF DESCRIPTION OF THE DRAWINGS

Other features and advantages of the present invention will appear from the following description of a particular embodiment, said description being made with reference to the appended drawings, of which:

FIG. 1 is a functional diagram of a frequency locking device according to the present invention;

FIG. 2 is a graph showing the voltage/frequency response curve of a frequency discriminator and, FIG. 3 is a graph showing the frequency/voltage response curve of a variable frequency oscillator.

DESCRIPTION OF A PREFERRED EMBODIMENT

A frequency locking device for an oscillator 1 comprises, according to the present invention, a frequency discriminator 2, the input of which is connected by means of a change-over switch 3, either to the output of the oscillator 1 or to the output of a generator 4 of signals at calibrated and stable frequencies Fo and F1. The connection to the oscillator 1 is made through a coupler 5, placed at the output of the oscillator, and a frequency divider circuit 6. The connection to the generator 4 is made through a second change-over switch 7. The role of the divider circuit is to obtain a signal, the frequency of which is in the pass-band of the frequency discriminator 2.

The output of the frequency discriminator 2 is connected to a circuit 8 for the preparation of two deviation voltages which appear at two output terminals, one of which is connectly directly to a first input of a comparator 9 while the other is connected to a second input of said comparator 9 by means of a pre-positioning circuit 10. The output of the comparator 9 is connected to the input of the oscillator 1 by means of a third change-over switch 21 and a circuit 11 for the transposition of the pre-positioning voltage.

The first, second and third change-over switches 3, 7 and 21, and the circuits 8 and 11 respectively receive control signals from a sequential circuit 12 through conductors 29, 28, 31, 32, 33, 30 and 34. The start of the sequence can be commanded either by an external signal SEXT or by a signal given by a threshold circuit 13 which receives the signals applied to the comparator 1.

The oscillator 1 is, for example, of the voltage controlled type with variable frequency, commonly known by the abbreviation VCO. The voltage is given by the transposition circuit 11.

The generator 4 of signals at frequencies Fo and F1 may be formed by two quartz oscillators, the frequencies of which are stable in time or, again, by a single quartz oscillator, at the frequency Fo for example, and a variable frequency F1 oscillator which is voltage controlled in a control loop, the reference frequency of which is Fo.

The frequency discriminator 2 is of any known type but must have good linearity. It is made, for example, in a logic form which implies that the signals are applied to it in logic form, namely in the form of square or rectangular signals, at the frequencies Fo, F1 and Fi. The frequency discriminator 2 gives, for example, a signal for which the mean power varies linearly with the frequency of the signal applied to it.

The circuit 8 for the preparation of the deviation voltages comprises two sampling/holding circuits 14 and 15 and two comparators 16 and 17. Each sampling-/holding circuit 14 or 15 is connected to the output of the frequency discriminator 2 and samples the signal applied to it when it receives a control signal, Ech1 for the circuit 14 and Ech0 for the circuit 15, said signals being given by the sequential circuit 12. Apart from the sampling, these circuits 14, 15 memorize the sample signal. The signal Vo, memorized by the circuit 15, is applied to the two comparators 16 and 17 while the signal V1, memorized by the circuit 14, is applied only to the comparator 16 at the second input. Furthermore, the output signal Vi of the frequency discriminator 2 is applied directly to the second input of the comparator 17. The comparator 16 gives a deviation signal $vo = Vo - V1$ while the comparator 17 gives a deviation signal $v = Vi - Vo$.

As shall be explained further below to describe the operation of the device, the signal V1 measures the frequency F1 while the signal Vo measures the frequency Fo, and the result thereof is that their difference vo measures the difference in frequency Fo−F1. Since the frequencies Fo and F1 are assumed to be fixed, the variation of vo can come only from the frequency discriminator 2. In other words, the voltage vo measures the shift of the discriminator. It is this voltage that is applied to the pre-positioning circuit 10, to act as a reference for it and thus obtain a pre-positioning voltage Vp which varies as a function of the characteristics of the frequency discriminator 2.

Furthermore, the voltage $v = Vi - Vo$ measures the frequency deviation of Fi−Fo, and is applied to the comparator 9 where it is compared with the pre-positioning voltage Vp so as to obtain a logic signal "0" or "1", depending on whether the signal v is greater than or smaller than Vp.

The pre-positioning circuit 10 is of any known type and comprises, for example, a digital/analog converter 18 and a programmable memory 19 which is addressed by codes on the group of conductors 20, each code defining a frequency Fp to be obtained at the output of the oscillator 1. The addressing code selects a number, in the memory 19, which defines the voltage Vp in a digital form and which controls the digital/analog converter 18. This voltage Vp depends on the deviation $vo = Vo - V1$ which is used as the reference voltage for the converter 18.

The circuit 11 for the transposition of the pre-positioning voltage includes a register 22, a digital/analog converter 23, connected to the outputs of the register 22, and a voltage shift circuit 27 connected to the output of the converter 23. This register 22 is designed so as to performs successive approximations under the control of the signals applied to it, namely a starting signal given by the sequential circuit 12, clock signals H also given by the sequential circuit 12 and logic signals given by the comparator 9.

The threshold circuit 13 includes a unit gain amplifier 24 and two comparators 25 and 26 which receive, at a first input, the output signal from the amplifier 24 and, at a second input, a positive reference voltage Sp for the comparator 25 and a negative reference voltage Sn for the comparator 26. Each comparator 25 or 26 gives a logic signal "0", when the voltage v−Vp ranges between Sn and Sp, and a logic signal "1" when the voltage v−Vp is greater, in absolute value, than Sn or Sp.

The working of the frequency locking device of the oscillator 1 is as follows, assuming that it is sought to obtain a frequency Fp at the output of the oscillator 1. To this frequency Fp, there corresponds an addressing code Cp of the memory 19 in the group of conductors 20, and a frequency Fi at the output of the frequency divider circuit 6. The locking device of FIG. 1 is used to compute, by successive approximations, the voltage V to be applied to the oscillator 1 to obtain a frequency Fp signal at its output.

This addressing code Cp is concomitant with a starting signal SEXT applied to the sequential circuit 12. This circuit 12 first gives signals for the control of the change-over switches 3, 7 and 21 to place them, respectively, in the positions "1", "0" and "0". The result thereof is that the control loop is open at two places: at the output of the divider circuit 6 and at the output of the circuit of the comparator 9. A signal with a frequency Fo is applied to the frequency discriminator 2 which then gives a voltage Vo proportionate to Fo. This voltage is sampled and stored by the sampling-/holding unit 15 when the sequential circuit 12 gives a signal Ech0. The sampled voltage has the value Vo. The sequential circuit 12 then gives a signal which places the switch 7 in the position "1" so that the discriminator 2 receives a signal at the frequency F1 and then gives a voltage V1 proportionate to F1. A signal Ech1, prepared by the sequential circuit 12, enables the sampling and memorizing of this value V1 in the sampling/holding unit 14. These two voltages Vo and V1, applied to the comparator 16, give a deviation voltage $vo = Vo - V1$ which is proportionate to the frequency deviation Fo−F1. Thus, in the event of variation in the characteristics of the discriminator 2, notably the slope of the curve 40 of FIG. 2, a voltage vo is obtained which is different but remains proportionate to the difference Fo−F1. This deviation voltage vo serves as a reference voltage for the digital/analog converter 18.

The number read in the memory 19, by means of the addressing code Cp, represents the frequency Fp to be obtained, given the curve of the frequency of the oscillator 1 as a function of the control voltage, but taking into account what is represented, in frequency, by the deviation $vo = Vo - V1$. In other words, if F designates the elementary variation in frequency, or elementary step, at the output of the oscillator 1, there is an elementary frequency step f corresponding to it at the output of the divider circuit 6. The difference Fo−F1 represents m elementary steps f, i.e. Fo−F1=mf and m elementary steps F at the output of the oscillator 1 such that Fs=Fc+mF. It can be understood then that if it is sought to obtain a frequency Fs=Fc+mF, it would be necessary to obtain a votage Vm, at the output of the converter 18, which is equal to vo, i.e. that the multiplier coefficient of the converter should be equal to one.

Since the discriminator 2 has a linear response, to obtain a frequency Fs=Fc+pF, a multiplier coefficient p/m must be recorded in the memory 19.

After the reference voltage $vo = Vo - V1$ is obtained, the next operation consists in closing the control loop by acting on the change-over switches 3 and 21 to place them respectively in the positions "0" and "1", by means of the conductors 29 and 31 and by setting the register 22 at a half value by means of the conductor 30: this corresponds to the central frequency Fc. A signal with a frequency close to Fo is thus applied to the discriminator 2, which gives a signal Vo so that a signal v=Vi−Vo, close to zero, is applied to an input of the comparator 9, with the other input receiving a signal Vp=p/mVe when the frequency to be obtained is Fs=Fc+pF. Since v is smaller than Vp, it means that Fc is smaller than Fs and that it is, therefore, necessary to increase the control voltage of the oscillator 1 to obtain in increase in frequency, assuming that the response curve of the oscillator as a function of its control voltage is that of FIG. 3.

It is thus that, if the register 22 has 12 positions, its initial value will be the binary number:

0111 1111 1111 (1)

If v is smaller than Vp, at the clock signal H on the conductor 34, the binary number displayed by the register 22 becomes:

1011 1111 1111 (2)

namely that the number (1) is increased by a value equal to half of the most significant digit. On the contrary, if v had been greater than Vp, the binary number displayed by the register 22 would have become:

0011 1111 1111 (3)

namely that the number (1) will have been reduced by a value equal to half of the most significant digit.

The binary number (2), through the effect of the converter 23 and the voltage shift circuit 27, increases the control voltage of the oscillator 1, and the frequency of the latter rises: this gives a new value of Fs and Fi and, therefore, of v. If this new value of v is smaller than Vp, at the clock signal H, the binary number displayed by the register 22 becomes:

1101 1111 1111 (4)

i.e. that the number (2) is increased by a value equal to a quarter of the most significant digit. If not, the most significant digit is reduced by a value equal to a quarter of the most significant digit to obtain:

0001 1111 1111 (5)

These plus or minus incrementations of the register 22 are done as a function of the results of successive comparisons in the comparator 9 and at the rate of the clock signals H until the least significant digit is obtained, namely after twelve clock pulses H if this binary number has twelve digits. At the end of this cycle of successive comparisons and approximations, the voltage v=Vo−Vi is appreciably equal to the voltage vp with an error equal, at the most, to the value of the least significant figure. We then have Fs=Fc+pF, and the frequency control loop is then opened by opening the switch 21 through a signal on the conductor 31.

It is clear that this pre-positioning cycle should be performed whenever there is a change in the frequency, but it may be provided that it will be done systematically at instants between two changes, in triggering the sequential circuit 12 at regular intervals. It is thus possible to repeat a cycle of this type for a given frequency Fs whenever a significant modification is detected in the frequency Fs. Control of this type can be obtained by means of the threshold circuit 13 which receives the voltages v and Vp, and compares their difference with thresholds Sn and Sp so as to trigger the sequential circuit 12 as soon as there is detection of a variation in the frequency Fs which results from a variation of v−Vp greater than the thresholds Sn and Sp. In this way, a frequency locking of the oscillator 1 is obtained, thus making it possible to take into account shifts in the characteristics of the different components, notably the characteristics of the frequency discriminator 2 and the oscillator 1.

The frequency locking device which has just been described thus makes it possible to do away with the modifications of the characteristics of the frequency discriminator, in the first place, but also those of other elements of the device such as the digital/analog converters 18 and 23, the voltage shift circuit 27 or, again, the sampling-holding units 14 and 15 and the comparators 16 and 17.

The locking device according to the invention can be used in a phase locking system to bring the frequency of the signal to the zone for the capture of the control loop in phase.

What is claimed is:

1. A frequency locking device for an oscillator of a type with voltage control of frequency of said oscillator, which comprises a frequency discriminator to which there is applied a first frequency signal Fi, having a determined frequency relationship with the frequency Fp of the output signal of said oscillator, said frequency locking device further comprising:

a first generator of a second signal with a frequency Fo;

a second generator of a third signal with a frequency F1;

switching-over means to apply the second and third signals and then the first signal, successively, to the frequency discriminator;

means coupled to an output of said frequency discriminator to give, firstly, a first voltage vo representing the frequency deviation Fo−F1 and, secondly, a second voltage v representing the frequency deviation Fi−Fo;

means to prepare, using the first voltage vo, a control voltage V to be applied to said oscillator to obtain a determined frequency Fp, and a sequential circuit to prepare control signals for the above-mentioned means.

2. A frequency locking device according to claim 1, wherein the means to prepare control voltage V comprise:

a pre-positioning circuit which, receiving firstly a code Cp representing the frequency Fp to be obtained and, secondly, the voltage vo, gives a voltage Vp representing said control voltage which depends on the slope of the voltage curve as a function of the frequency of said frequency discriminator;

a comparator which compares said representative voltage Vp with the voltage v and gives a logic signal according to the result of the comparison;

a circuit to prepare the control voltage V of the oscillator, which determines this voltage by successive approximations according to the logic signal given by the comparator.

3. A frequency locking device according to claim 2, further comprising a threshold circuit which gives a deviation voltage representing the difference voltage v−Vp, said deviation voltage being compared with pre-determined thresholds so as to give a signal to trigger the sequential circuit as soon as the deviation voltage goes beyond said pre-determined thresholds.

4. A frequency locking device according to claim 1, comprising means to trigger the sequential circuit at determined time intervals.

5. A frequency locking device according to claim 2, wherein the pre-positioning circuit comprises a digital/analog converter and a memory which, when addressed by a code Cp, gives a binary number to control said converter so as to obtain the voltage Vp from the first voltage vo.

6. A frequency locking device according to claim 2, wherein the circuit to prepare the control voltage V comprises a successive approximations register followed by a digital/analog converter and a circuit for transposition of the output voltage of the converter, said register being controlled by the output logic signal of the comparator so that one or two bistable circuits change their state depending on the value of said logic signal of the comparator.

7. A frequency locking device according to claim 1, wherein the means to give comprise two sampling-holding circuits, of which one gives a signal Vo proportionate to the frequency Fo and the other gives a signal V1 proportionate to the frequency F1, and two comparators of which one gives the voltage $vo = Vo - V1$ and the other gives the voltage $v = Vi - Vo$, where Vi is the output of said frequency discriminator when said first frequency signal Fi is applied to it.

8. A frequency locking device according to claim 1, wherein the first and second generators each consist of a quartz oscillator.

9. A frequency locking device according to claim 1, wherein the first and second generators are formed by a single quartz oscillator.

* * * * *